(12) United States Patent
Chen et al.

(10) Patent No.: US 8,526,182 B2
(45) Date of Patent: Sep. 3, 2013

(54) COOLING CIRCULATION SYSTEM OF SERVER

(75) Inventors: Chien-An Chen, Taipei (TW);
Kai-Yang Tung, Taipei (TW);
Mao-Ching Lin, Taipei (TW)

(73) Assignee: Inventec Corporation, Taipei (TW)

( * ) Notice: Subject to any disclaimer, the term of this patent is extended or adjusted under 35 U.S.C. 154(b) by 235 days.

(21) Appl. No.: 13/158,644

(22) Filed: Jun. 13, 2011

(65) Prior Publication Data

US 2012/0111533 A1    May 10, 2012

(30) Foreign Application Priority Data

Nov. 5, 2010   (TW) ................................ 99138226 A

(51) Int. Cl.
*H05K 7/20*        (2006.01)

(52) U.S. Cl.
USPC ............. 361/696; 361/679.48; 361/679.5; 361/695; 361/724; 165/80.3; 165/104.33; 165/122; 165/127; 454/184

(58) Field of Classification Search
USPC ........... 361/679.01, 679.02, 679.46–679.53, 361/679.5, 688, 689–695, 715–727; 62/259.2, 62/267, 441; 165/80.2–80.5, 104.33, 121–126, 165/185; 312/223.2, 223.3, 236; 174/50, 174/54, 59, 60, 520; 454/184
See application file for complete search history.

(56) References Cited

U.S. PATENT DOCUMENTS

| | | | |
|---|---|---|---|
| 6,775,137 B2 * | 8/2004 | Chu et al. | 361/696 |
| 6,819,563 B1 * | 11/2004 | Chu et al. | 361/696 |
| 7,051,802 B2 * | 5/2006 | Baer | 165/299 |
| 7,085,133 B2 * | 8/2006 | Hall | 361/695 |
| 7,170,745 B2 * | 1/2007 | Bash et al. | 361/695 |
| 7,319,594 B2 * | 1/2008 | Nicolai et al. | 361/724 |
| 7,511,960 B2 | 3/2009 | Hillis et al. | |
| 8,004,839 B2 * | 8/2011 | Sato et al. | 361/696 |
| 8,328,026 B2 * | 12/2012 | Boduch et al. | 211/26 |
| 8,387,687 B2 * | 3/2013 | Baer | 165/299 |
| 2008/0232064 A1 * | 9/2008 | Sato et al. | 361/687 |
| 2009/0122483 A1 * | 5/2009 | Hall | 361/688 |
| 2011/0317357 A1 * | 12/2011 | Sato et al. | 361/679.48 |

* cited by examiner

*Primary Examiner* — Michail V Datskovskiy

(74) *Attorney, Agent, or Firm* — Morris Manning & Martin LLP; Tim Tingkang Xia, Esq.

(57) ABSTRACT

A cooling circulation system of a server includes a cabinet assembly, a plurality of first fan modules, a plurality of second fan modules, and two air guide hoods. The first fan modules and the second fan modules are disposed on the cabinet assembly. The first fan modules blow a first airflow towards a first direction, and the second fan modules blow a second airflow towards a second direction. The air guide hoods are respectively installed on two ends of the cabinet assembly. The first airflow and the second airflow join each other through the air guide hoods, so as to form a cooling circulation loop inside the cabinet assembly.

5 Claims, 5 Drawing Sheets

COOLING CIRCULATION SYSTEM OF SERVER

CROSS-REFERENCE TO RELATED APPLICATIONS

This non-provisional application claims priority under 35 U.S.C. §119(a) on Patent Application No(s). 099138226 filed in Taiwan, R.O.C. on Nov. 5, 2010, the entire contents of which are hereby incorporated by reference.

BACKGROUND OF THE INVENTION

1. Field of Invention

The present invention relates to a server cabinet, and more particularly to a cooling circulation system of a server.

2. Related Art

In recent years, Internet is rapidly and vigorously developed and expanded, especially in some large-scale enterprises or Internet business sites, an increasing amount of servers appear due to an expanded need of services, such that arrangement management of servers is more centralized to save the space occupied by the servers. The large amount of intensively arranged servers and other devices definitely will produce excessive heat, thereby resulting in an instable operation of an entire server system, which is an important problem that a data center has to face all the time.

Taking the data center as an example, in order to solve a heat radiation problem in an enclosed machine room (such as a container machine room) placed with a large amount of server racks, a currently conventional method is to configure a cooling air conditioning system inside the machine room to perform heat radiation. When the amount of the servers is small, heat sink fans of the servers are used for cooling and lowering temperature. However, as the amount of the servers is increasingly large and cabinet arrangement is increasingly compact, the cold air blown by the conventional cooling air conditioning system cannot sufficiently flow to each corner of the machine room at all, such that the hot air is easily accumulated in a particular region, thereby definitely causing instability of the server system.

A fan module inside a conventional server rack is installed on a top or a back side surface of the rack. In the disposing manner of installing the fan module on the top of the rack, a plurality of heat sink fans is installed on the top of the rack, so as to draw the hot air inside the server rack to the outside. However, a common server rack accommodates a plurality of servers and has a predetermined height. Therefore, during the process that the heat sink fans draw the hot air, a flow path of the hot air inside the servers is often blocked by the plurality of servers, such that the heat sink fan can only discharge the hot air adjacent to the top of the server rack, and has no apparent effect for the hot air on a bottom of the server rack. Therefore, the hot air is accumulated at the bottom of the server cabinet, and operation performance of the servers is seriously affected.

Conventionally, as the fan module is installed on the back side surface of the server rack, an airflow generated by the fan module respectively passes through channels between main boards of the servers, and then is discharged from a front side surface of the rack. Though the hot air may be prevented from being accumulated at the bottom of the server rack, since the hot air inside the servers is discharged to the outside by the conventional fan module in a manner of guiding the airflow or in a thermal convection manner, it cannot be ensured that the airflow generated by the fan module flows to the main boards or heating elements on the main boards of the servers. Therefore, the airflow spreads around inside the server rack, and cannot form a stable flow field inside the server rack. As a result, the heat radiation of the servers inside the server rack is uneven, and some servers are easily damaged due to the high temperature, thereby affecting an overall operation performance of the server rack.

In U.S. Pat. No. 7,511,960, a cooling system for a data center is disclosed, in which a plurality of closed-loop cooling paths of server racks are formed inside a container machine room, such that a stable flow field is generated inside the container machine room to perform cooling and heat radiation.

However, in the cooling system disclosed in the U.S. Pat. No. 7,511,960, it is necessary to design cold and hot channels inside the container machine room, so as to enable the flow field inside the container machine room to stably flow. In this manner, the amount of the server racks capable of being loaded inside a single container machine room is relatively limited and cannot reach a maximum amount, the overall operation performance of the data center cannot be improved, and more container machine rooms are required forcedly to successfully install a predetermined amount of the server racks.

SUMMARY OF THE INVENTION

Accordingly, the present invention is a cooling circulation system of a server, so as to eliminate problems in a design of a conventional server cabinet that heat radiation cannot be evenly performed on each server, cold and hot channels inside a machine room occupy too much usage space, so a single machine room cannot be loaded with a maximum amount of servers, and radiation performance and operation performance of the server cabinet or the machine room are not apparent.

The present invention provides a cooling circulation system of a server, which comprises a cabinet assembly, a plurality of first fan modules, a plurality of second fan modules, and two air guide hoods. The cabinet assembly has a plurality of serially arrayed racks. The first fan modules are installed on the racks and blow a first airflow towards a first direction, and the second fan modules are installed on the racks and blow a second airflow towards a second direction. The air guide hoods are respectively installed on two opposite ends of the cabinet assembly, and the two air guide hoods respectively have at least one fluid channel.

The first airflow generated by the first fan modules enters the fluid channel of one of the air guide hoods and joins the second airflow generated by the second fan module, and the second airflow generated by the second fan modules enters the fluid channel of the other air guide hood and joins the first airflow generated by the first fan modules, so as to form a cooling circulation loop.

The efficacies of the present invention lie in that, the cooling circulation loop can be formed inside the cabinet assembly of the server through the design of the air guide hoods, each cabinet assembly can independently perform a cooling and heat radiation operation, such that an effect of auto-circulating cooling can be achieved without disposing extra cold and hot channels inside the machine room. Therefore, the machine room can be loaded with the maximum amount of cabinet assemblies, thereby having the best operation performance.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
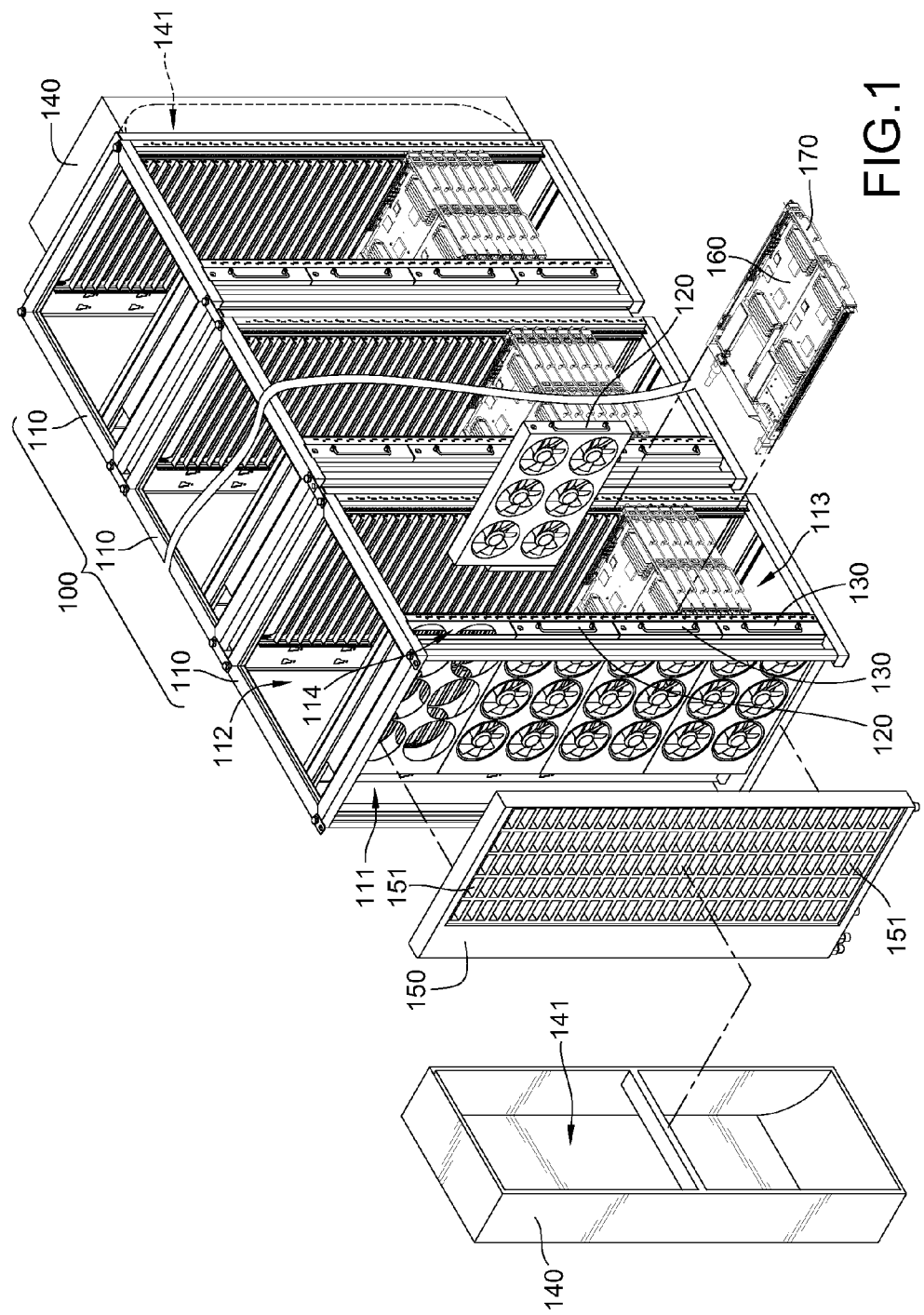
FIG. 1 is a schematic exploded view of a first embodiment of the present invention.
Figure 2:
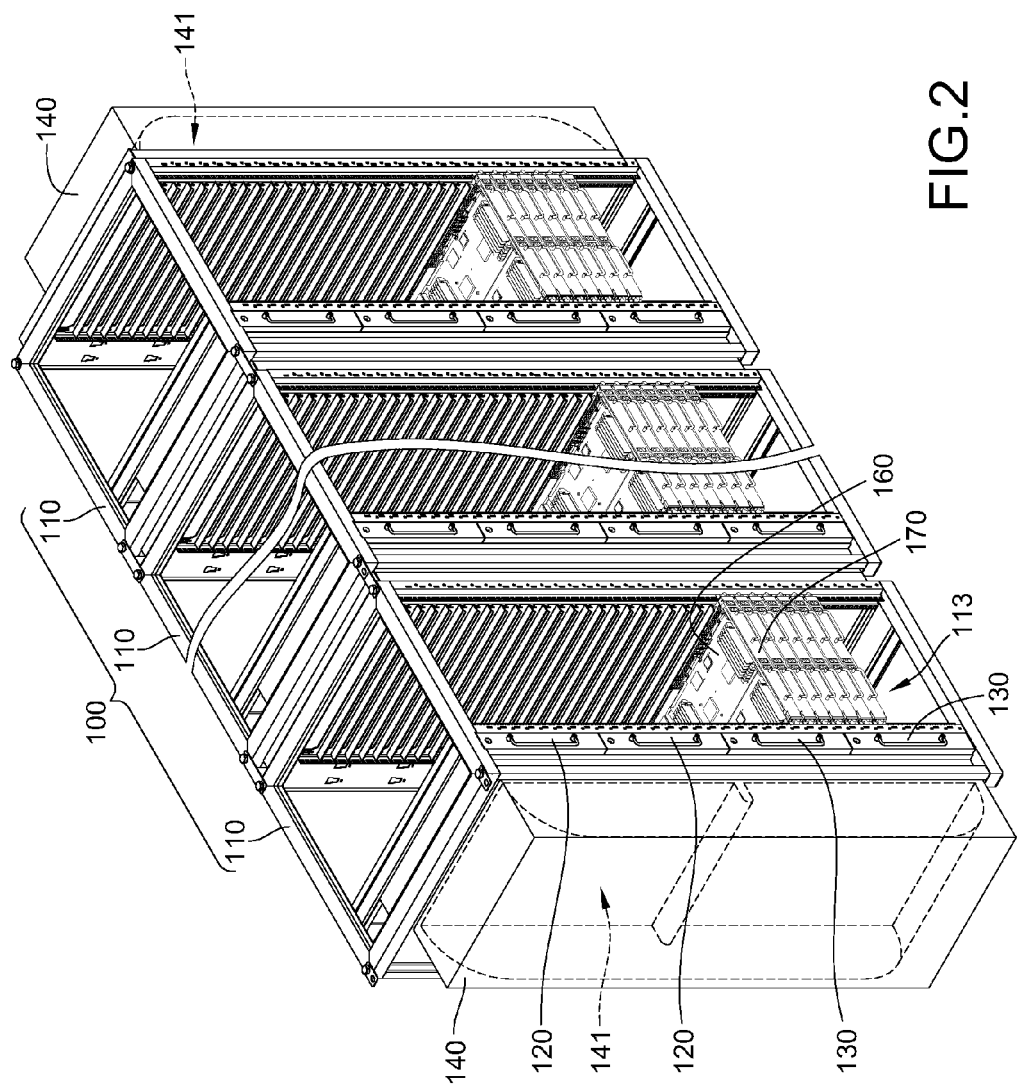
FIG. 2 is a schematic three-dimensional view of the first embodiment of the present invention.
Figure 3:
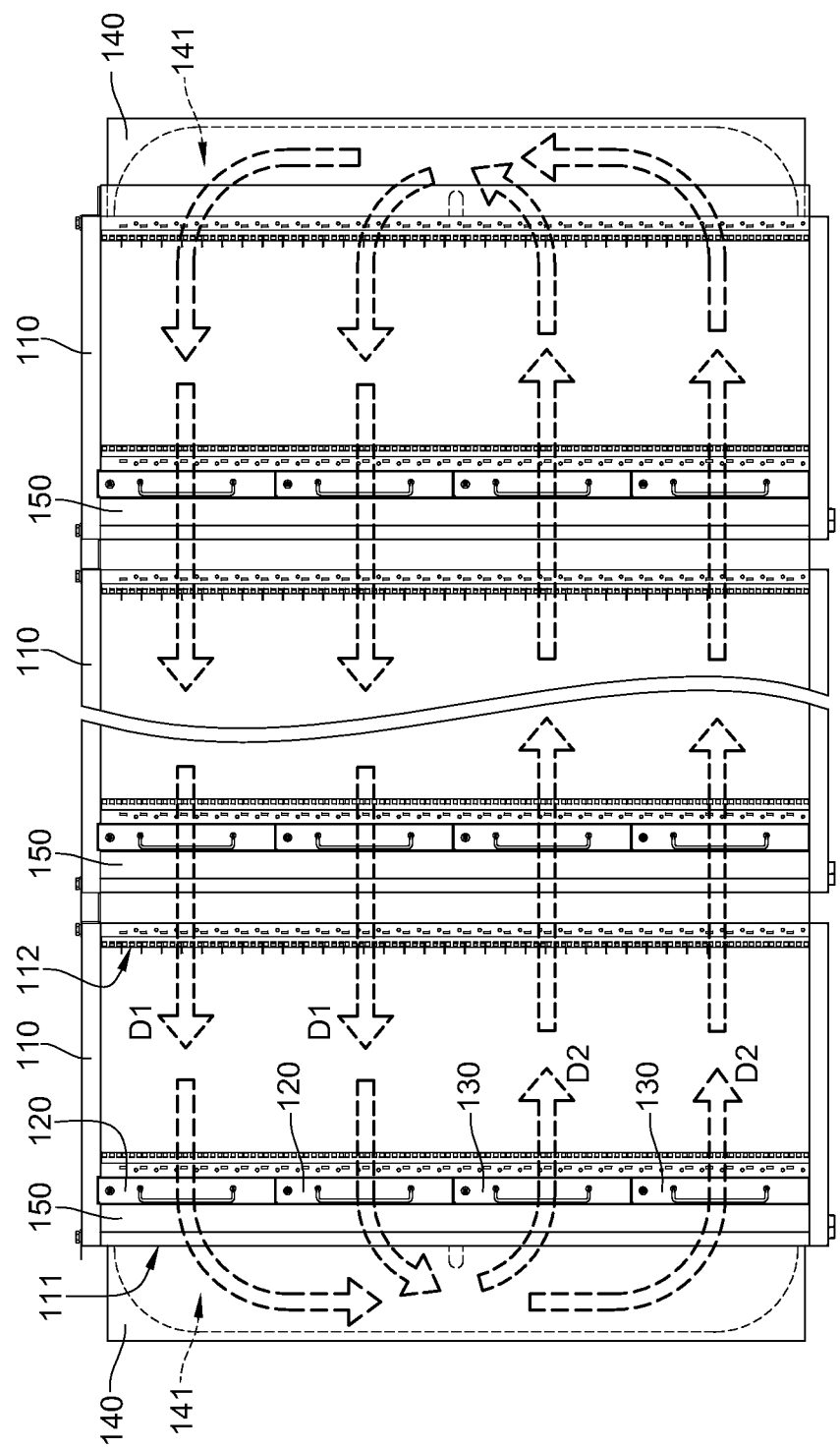
FIG. 3 is a schematic side view of the first embodiment of the present invention.

FIG. 1 to FIG. 3 are schematic three-dimensional views and a schematic side view of a first embodiment of the present invention. As shown in FIG. 1 to FIG. 3, a cooling circulation system of a server according to the present invention comprises a cabinet assembly 100, a plurality of first fan modules 120, a plurality of second fan modules 130, two air guide hoods 140, a radiator 150, a circuit board 160, and a bearing plate 170.

The cabinet assembly 100 has a plurality of racks 110, which are hollow frame bodies formed by a plurality of steel bars, steel panels, and pieces of angle steel. The rack 110 has a first side surface 111 and a second side surface 112 being opposite to each other and spaced apart from each other, so as to form an accommodation space inside the rack 110. The racks 110 are serially arrayed in sequence to form the cabinet assembly 100 in a manner that the first side surface 111 of each rack 110 faces the second side surface 112 of the adjacent rack 110. In addition, a plurality of cabinet assemblies 100 is placed inside a container machine room (not shown) to form a data center.

Further, an opening 113 is disposed on a side edge position of the rack 110, and the opening 113 is in communication with the accommodation space, such that the inside of the rack 110 can be in communication with the outside through the opening 113.

A plurality of assembly frames 114 is disposed on the first side surface 111 of the rack 110. The assembly frame 114 is located inside the accommodation space of the rack 110. The entire first side surface 111 (that is, the side surface where the assembly frames 114 are located) and the entire second side surface 112 (that is, the other side surface opposite to the assembly frames 114) of each rack 110 are a hollow structure, such that the first side surface 111 and the second side surface 112 form an air outlet/inlet with a large area, for being used as an outlet/inlet of airflows of the fan modules 120 and 130. The second side surface 112 of each rack 110 is connected with the first side surface 111 of the adjacent rack 110, such that the accommodation spaces inside the adjacent tracks 110 are in communication with each other (as shown in FIG. 3).

Still referring to FIG. 1 to FIG. 3, the first fan modules 120 and the second fan modules 130 are placed inside the assembly frames 114 of the racks 110 in a manner of lateral installation, such that the first fan modules 120 and the second fan modules 130 are maintained on the racks 110 without changing their installed positions. Therefore, the first fan modules 120 and the second fan modules 130 can stably blow airflows towards a first direction D1 and a second direction D2. The two air guide hoods 140 are respectively disposed on two opposite ends of the cabinet assembly 100. That is to say, one of the air guide hoods 140 is disposed on the first side surface 111 of the rack 110 at the outermost of the cabinet assembly 100, and the other air guide hood 140 is disposed on the second side surface 112 of the other rack 110 at the outermost of the cabinet assembly 100. A fluid channel 141 is designed inside the two air guide hoods 140 respectively, and is used to bring an outside airflow in the air guide hood 140 and guide its flow direction.

In particular, the first fan modules 120 of this embodiment are disposed inside the assembly frames 114 in an upper part of the racks 110, and blow the airflow towards the first direction D1. The second fan modules 130 are disposed inside the assembly frames 114 in a lower part of the racks 110, and blow the airflow towards the second direction D2. Therefore, the space inside the cabinet assembly 100 can be approximately divided into an upper part airflow flow region and a lower part airflow flow region being independent respectively due to placed positions of the first fan modules 120 and the second fan modules 130.

As shown in FIG. 1 to FIG. 3, the radiator 150 according to the present invention is installed on the first side surface 111 of the rack 110 (that is, the side surface of the rack 110 installed with the first fan modules 120 and the second fan modules 130), and is located outside the rack 110. That is to say, the first fan modules 120 and the second fan modules 130 are located between the radiator 150 and the second side surface 112 of the rack 110. In addition, a plurality of radiation holes 151 is opened on the radiator 150.

The radiator 150 according to the present invention is disposed adjacent to the first fan modules 120 and the second fan modules 130. The airflows blown by the first fan modules 120 and the second fan modules 130 are cooled by the radiator 150, and the radiator 150 is in communication with cooling water for heat radiation. Therefore, the radiator 150 can effectively lower temperature of the airflows blown by the first fan modules 120 and the second fan modules 130, such that the temperature blown to the racks 110 will not be too high, thereby producing a good convection radiation effect inside the cabinet assembly 100.

The bearing plate 170 according to the present invention can be made of a metal material. The circuit board 160 is placed on the bearing plate 170, passes through the opening 113 from a lateral direction of each rack 110 together with the bearing plate 170, and slides into and is loaded inside the accommodation space of the rack 110.

The circuit board 160 according to the present invention can also be directly loaded inside the rack 110 without an installation operation of the bearing plate 170. However, in order to prevent the circuit board 160 from directly contacting with the frame body of the rack 110, the bearing plate 170 provides a good protection effect, thereby effectively preventing the circuit board 160 from being damaged after colliding with the rack 110 due to an external force such as a shake.

Referring to FIG. 1 to FIG. 3, the first fan modules 120 and the second fan modules 130 are electrically connected with an external power supply unit respectively for being actuated. The first fan modules 120 generate a first airflow towards the first direction D1, and the first airflow crosses the upper part airflow flow region of the cabinet assembly 100 through the first side surfaces 111 and the second side surfaces 112 of the racks 110. The second fan modules 130 generate a second airflow towards the second direction D2, and the second airflow crosses the lower part airflow flow region of the cabinet assembly 100 through the first side surfaces 111 and the second side surfaces 112 of the racks 110.

At this time, the first airflow of the first fan modules 120 is blown to one of the air guide hoods 140 (that is, the air guide hood 140 installed on the first side surface 111 of the rack 110), passes through the fluid channel 141 of the air guide hood 140, and joins the second airflow of the second fan modules 130. The second airflow of the second fan modules 130 is blown to the other air guide hood 140 (that is, the air guide hood 140 installed on the second side surface 112 of the rack 110), passes through the fluid channel 141 of the air guide hood 140, and joins the first airflow of the first fan modules 120. Therefore, a cooling circulation loop is formed inside the cabinet assembly 100.

A circulating airflow joined by the first airflow and the second airflow passes through the radiation holes 151 of each radiator 150 and the first side surface 111 and the second side surface 112 of each rack 110, and then is blown to the circuit board 160 inside each rack 110. After performing convection heat radiation on the circuit board 160 in a single rack 110, the circulating airflow crosses the circuit board 160 and enters another adjacent rack 110 to perform heat radiation.

It should be noted that, in the present invention, the plurality of first fan modules 120, the plurality of second fan modules 130, and the plurality of assembly frames 114 of the rack 110 exist, and the plurality of radiators 150 exists, so as to provide an optimal heat radiation effect for the cabinet assembly 100. In addition, the plurality of the circuit boards 160 exists, so as to enable a single cabinet assembly 100 to have the maximum operation performance. The amount of each element of the cabinet assembly 100 corresponds to each other, and persons skilled in the art can increase or decrease the disposed amount according to actual usage requirements, and the present invention is not limited thereto.

Figure 4:
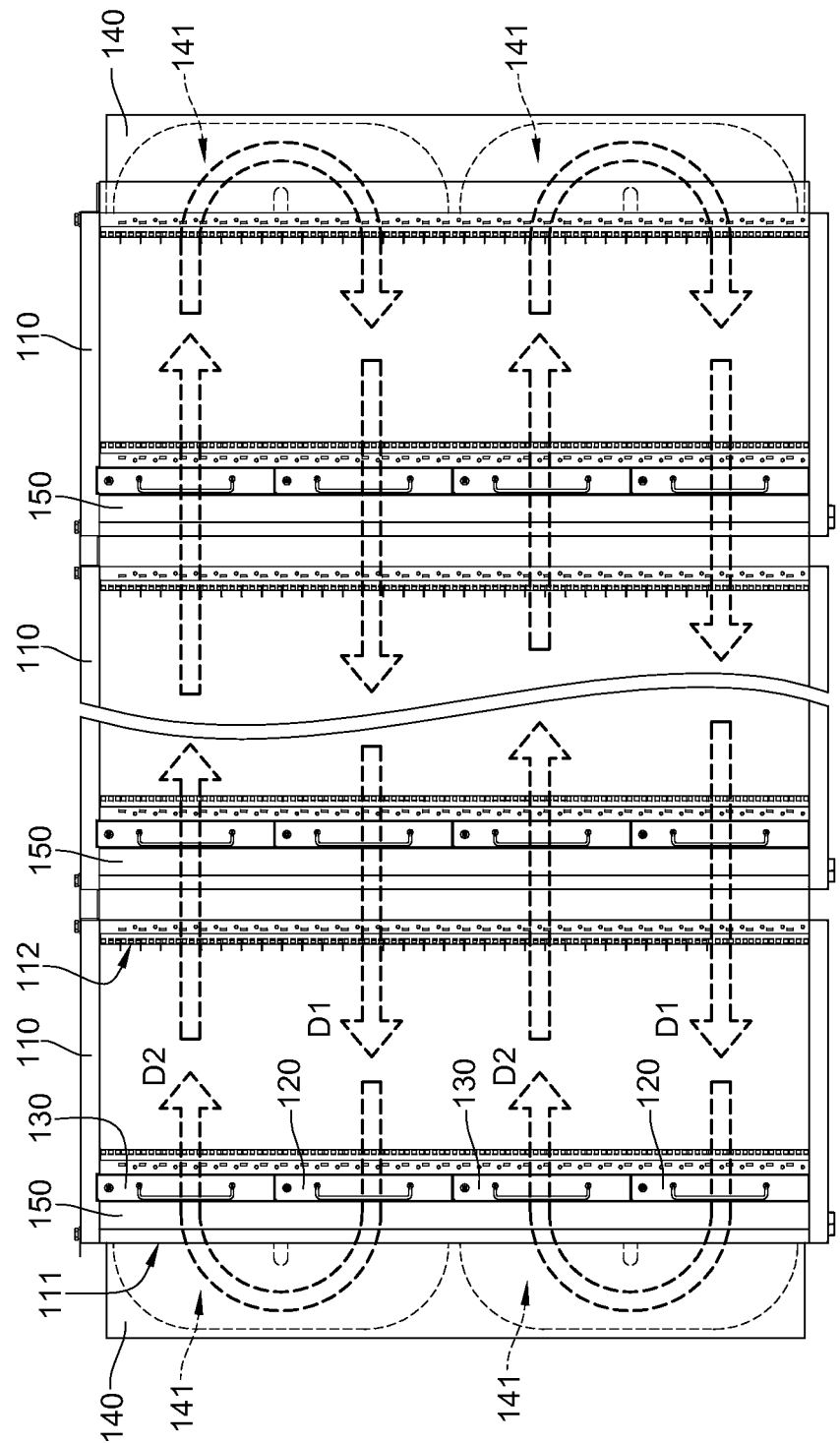
FIG. 4 is a schematic side view of a second embodiment of the present invention.

FIG. 4 is a schematic side view of a second embodiment of the present invention. A specific structure of the second embodiment of the present invention is similar to that of the first embodiment, and disposed positions of the first fan modules 120 and the second fan modules 130 of the cabinet assembly 100 according to the second embodiment of the present invention are slightly different from those of the first embodiment. The differences between the two embodiments will be described as follows.

Referring to FIG. 4, and referring to FIG. 1 at the same time, the first fan modules 120 and the second fan modules 130 according to the second embodiment of the present invention are installed inside the assembly frames 114 of the racks 110, and the first fan modules 120 and the second fan modules 130 are disposed on the racks 110 in an alternate arrangement manner. This embodiment is described with a combination of two first fan modules 120 and two second fan modules 130, and the present invention is not limited to the amount. Each air guide hood 140 has two fluid channels 141 inside, which respectively correspond to the combination of the first fan modules 120 and the second fan modules 130. The first airflow of the two first fan modules 120 is respectively blown to the two fluid channels 141 of the air guide hood 140, and joins the second airflow of the second fan modules 130. The second airflow of the second fan modules 130 is respectively blown to the two fluid channels 141 of the air guide hood 140, and joins the first airflow of the first fan modules 120. Therefore, two cooling circulation loops are formed inside the cabinet assembly 100.

Therefore, with the cooperation of the first fan modules 120 and the second fan modules 130, upper part and lower part spaces inside the cabinet assembly 100 respectively form at least two complete and independent cooling circulation loops. It should be noted that, in this embodiment, the second fan modules 130 are loaded on the top of the racks 110, and the first fan modules 120 and the second fan modules 130 are alternately arranged, such that the cooling circulation loops inside the cabinet assembly 100 are operated in a clockwise direction. However, persons skilled in the art can also load the first fan modules 120 on the top of the racks 110, and the first fan modules 120 and the second fan modules 130 are alternately arranged, such that the cooling circulation loops inside the cabinet assembly 100 are operated in a counterclockwise direction.

The design of the second embodiment of the present invention can significantly reduce travel paths of the circulating airflows generated by the fan modules 120 and 130, thereby further improving the overall cooling performance of the cabinet assembly 100.

Figure 5:
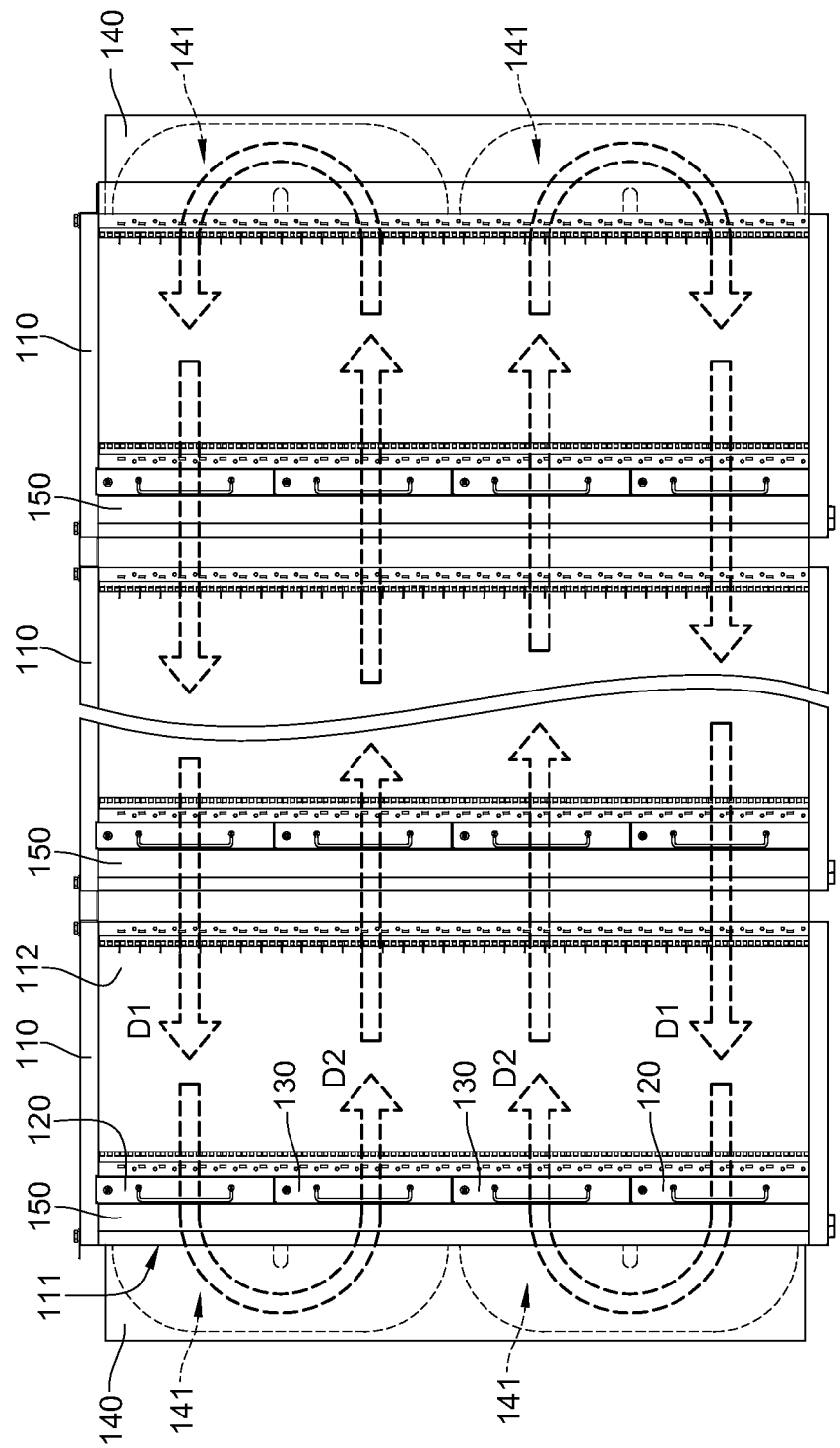
FIG. 5 is a schematic side view of a third embodiment of the present invention.

Definitely, positions of the first fan modules 120 and the second fan modules 130 according to the present invention installed on the racks 110 can also be changed, as shown in a schematic side view of a third embodiment of FIG. 5. The first fan modules 120 according to the third embodiment are loaded on the top of the racks 110, such that the cooling circulation loop of the upper part of the cabinet assembly 100 of this embodiment is operated in the counterclockwise direction, and the cooling circulation loop of the lower part of the cabinet assembly 100 is operated in the clockwise direction. The design of the third embodiment of the present invention can also reduce the travel paths of the circulating airflows generated by the fan modules 120 and 130, thereby further improving the overall cooling performance of the cabinet assembly 100.

In addition, the disposed positions of the first fan modules 120 and the second fan modules 130 according to the present invention can also be changed, for example, the first fan modules 120 and the second fan modules 130 are installed on the bearing plate 170 or any suitable position of the racks 110. As long as the first fan modules 120 and the second fan modules 130 blow the airflows towards the different directions, the fan modules 120 and 130 are not limited to be loaded inside the assembly frames 114 of the racks 110.

With the cooperative design of the fan modules and air guide hoods of the server according to the present invention, at least one cooling circulation loop is formed inside the cabinet assembly according to the present invention, such that each cabinet assembly can become an independent module and respectively perform an auto-circulating cooling operation.

Therefore, in the present invention, it is not necessary to design extra cold and hot channels inside the container machine room, such that the usage space of the container machine room can be most effectively used. In addition, the machine room can be loaded with a maximum amount of the cabinet assemblies, such that the best operation performance can be achieved.

What is claimed is:

1. A cooling circulation system of a server, comprising:
  a cabinet assembly, having a plurality of serially arrayed racks;
  a plurality of first fan modules, respectively disposed on the racks and blowing a first airflow towards a first direction;
  a plurality of second fan modules, respectively disposed on the racks and blowing a second airflow towards a second direction; and
  two air guide hoods, respectively installed on two opposite ends of the cabinet assembly, wherein each air guide hood has two fluid channels, and the first airflow of the first fan modules and the second airflow of the second fan modules respectively enter the two fluid channels, so as to form two cooling circulation loops.

2. The cooling circulation system of the server according to claim 1, wherein each rack has a first side surface and a second side surface being opposite to each other, the first side surface of each rack and the second side surface of each rack are a hollow structure, and the racks are serially arrayed in sequence to form the cabinet assembly in a manner that the first side surface of each rack faces the second side surface of the adjacent rack.

3. The cooling circulation system of the server according to claim 2, wherein the first side surface of each rack further has a plurality of assembly frames, and the first fan modules and the second fan modules are respectively installed inside the assembly frames.

4. The cooling circulation system of the server according to claim 2, further comprising a plurality of radiators, respectively installed on the first side surface of each rack, wherein the first fan modules and the second fan modules are located between the radiator and the second side surface.

5. The cooling circulation system of the server according to claim 4, wherein the radiators respectively have a plurality of radiation holes, and the first airflow and the second airflow enter the two fluid channels of the two air guide hoods through each radiation hole, each first side surface, and each second side surface.

* * * * *